(12) United States Patent
Kanne et al.

(10) Patent No.: US 10,284,632 B2
(45) Date of Patent: *May 7, 2019

(54) ELECTRONIC TESTING DEVICE

(71) Applicant: WOW Insites LLC, Elkhorn, NE (US)

(72) Inventors: Steven Kanne, Gretna, NE (US);
Gordon Whitten, Omaha, NE (US);
Jamie Bumgardner, Gretna, NE (US);
Joshua Galley, Bennington, NE (US);
Dixon Greenfield, Elkhorn, NE (US);
Brian Kenkel, Elkhorn, NE (US);
Steven Nichols, Elkhorn, NE (US);
Chad Bokowski, Elkhorn, NE (US);
Sam Miller, Elkhorn, NE (US)

(73) Assignee: WOW INSITES LLC, Elkhorn, NE (US)

( * ) Notice: Subject to any disclaimer, the term of this patent is extended or adjusted under 35 U.S.C. 154(b) by 399 days.

This patent is subject to a terminal disclaimer.

(21) Appl. No.: 15/192,217

(22) Filed: Jun. 24, 2016

(65) Prior Publication Data

US 2016/0381123 A1 Dec. 29, 2016

Related U.S. Application Data

(63) Continuation-in-part of application No. 14/230,990, filed on Mar. 31, 2014, now Pat. No. 9,400,301.
(Continued)

(51) Int. Cl.
*G01R 31/08* (2006.01)
*H04L 29/08* (2006.01)
*G01R 31/02* (2006.01)
*H04W 4/80* (2018.01)
*H04Q 9/00* (2006.01)
(Continued)

(52) U.S. Cl.
CPC ............ *H04L 67/10* (2013.01); *G01R 31/021* (2013.01); *G08C 17/02* (2013.01); *H04Q 9/00* (2013.01); *H04W 4/80* (2018.02); *G08C 2201/93* (2013.01); *H04B 1/00* (2013.01);
(Continued)

(58) Field of Classification Search
CPC .. G01R 31/021; G08C 17/02; G08C 2201/93; H04B 1/00; H04B 2201/00; H04L 2201/00; H04L 67/02; H04L 67/10; H04Q 2209/40; H04Q 9/00; H04W 4/80
See application file for complete search history.

(56) References Cited

U.S. PATENT DOCUMENTS 5,436,555 A * 7/1995 Locke .................. G01R 31/023
324/133
6,344,748 B1 2/2002 Gannon
(Continued)

*Primary Examiner* — Vinh P Nguyen
(74) *Attorney, Agent, or Firm* — Suiter Swantz pc llo

(57) ABSTRACT

Systems and methods for cabling verification may include one or more operations including, but not limited to: receiving floor plan data representing a floor plan of a premises; receiving at least one user input specifying a location of at least one cabling endpoint relative to the floor plan; receiving at least one user input selecting at least one cabling verification test for the at least one cabling endpoint; receiving one or more cabling verification test results for the at least one cabling endpoint obtained by at least one testing device; and updating at least one database element associated with the at least one cabling endpoint and maintained by the cloud-based server.

20 Claims, 17 Drawing Sheets

Related U.S. Application Data

(60) Provisional application No. 61/806,554, filed on Mar. 29, 2013, provisional application No. 61/877,813, filed on Sep. 13, 2013.

(51) Int. Cl.
*G08C 17/02* (2006.01)
*H04B 1/00* (2006.01)

(52) U.S. Cl.
CPC .......... *H04L 67/02* (2013.01); *H04L 2201/00* (2013.01); *H04Q 2209/40* (2013.01)

(56) References Cited

U.S. PATENT DOCUMENTS

| | | |
|---|---|---|
| 6,971,063 B1 | 11/2005 | Rappaport et al. |
| 7,358,745 B1 * | 4/2008 | Lo ........................... H04L 43/50 324/533 |
| 7,366,630 B2 * | 4/2008 | Vogel ....................... H02G 3/00 702/117 |
| 7,385,406 B1 | 6/2008 | Blades |
| 7,884,616 B2 | 2/2011 | Oruganty |
| 8,649,421 B2 * | 2/2014 | Renken .............. H04N 7/17309 375/222 |
| 8,886,474 B2 * | 11/2014 | Chimanbhai ............ H04B 3/46 379/22 |
| 2005/0083067 A1 | 4/2005 | Kirbas |
| 2005/0264299 A1 | 12/2005 | Manani et al. |
| 2008/0224712 A1 | 9/2008 | Peyton et al. |
| 2011/0270561 A1 | 11/2011 | Gregg et al. |
| 2012/0051735 A1 | 3/2012 | Achkir et al. |
| 2012/0059605 A1 | 3/2012 | Chimanbhai et al. |
| 2012/0213259 A1 | 8/2012 | Renken et al. |
| 2013/0178203 A1 | 7/2013 | Venkataraman |
| 2017/0104664 A1 * | 4/2017 | Bezold ................ H04L 41/0813 |

\* cited by examiner

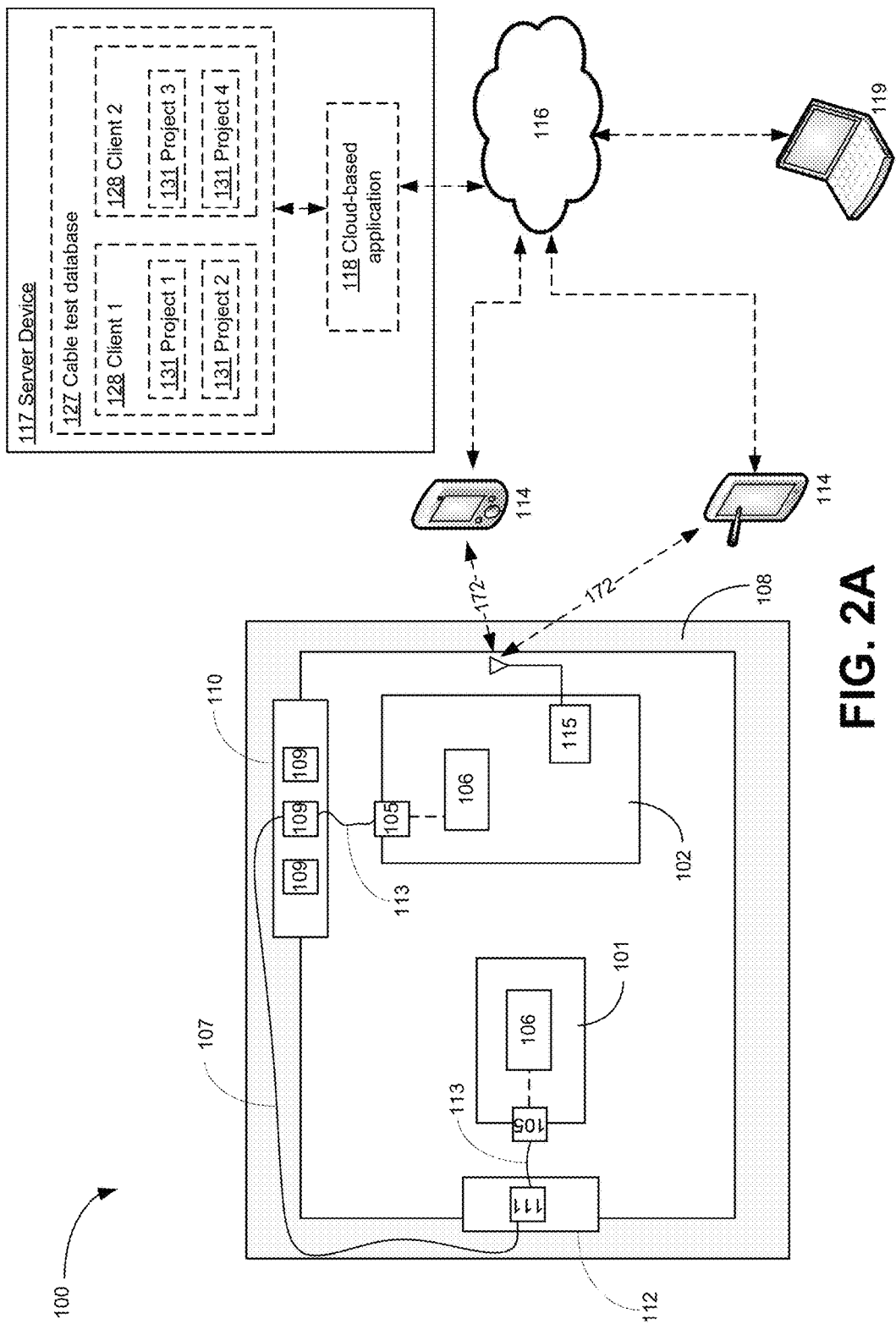

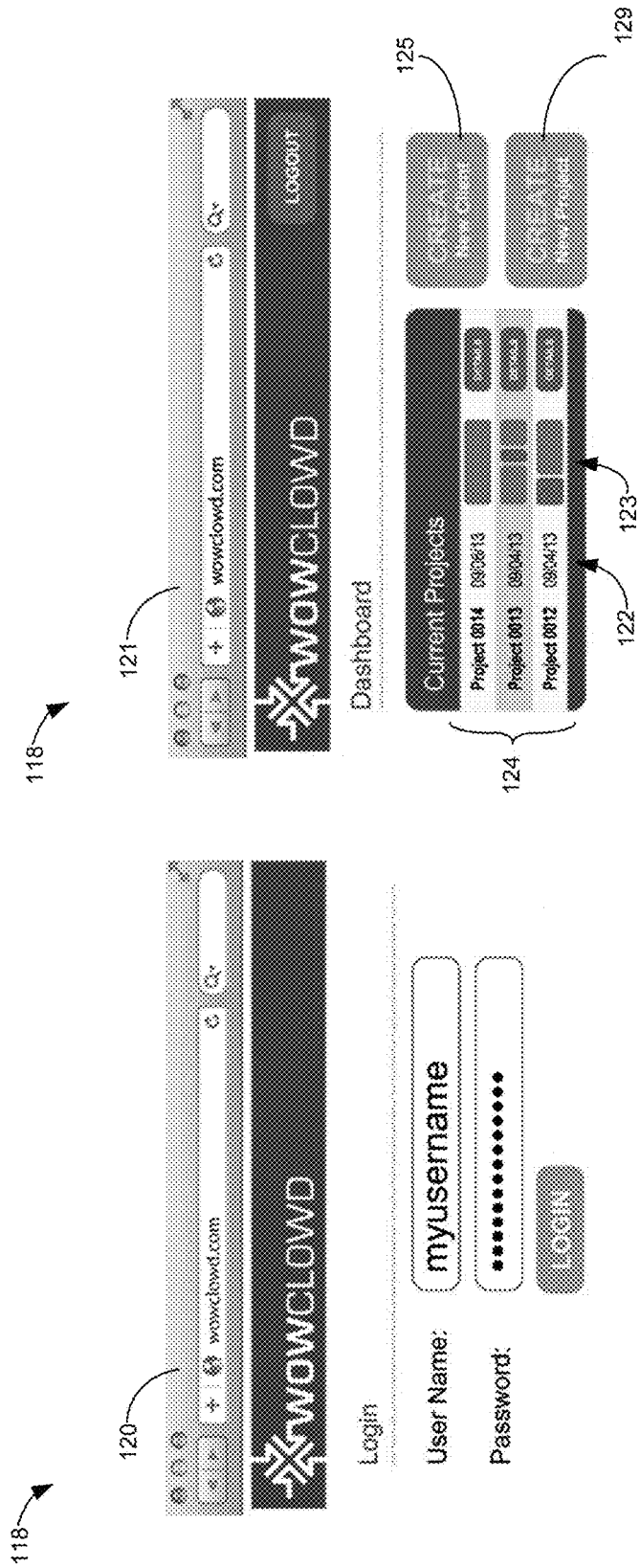

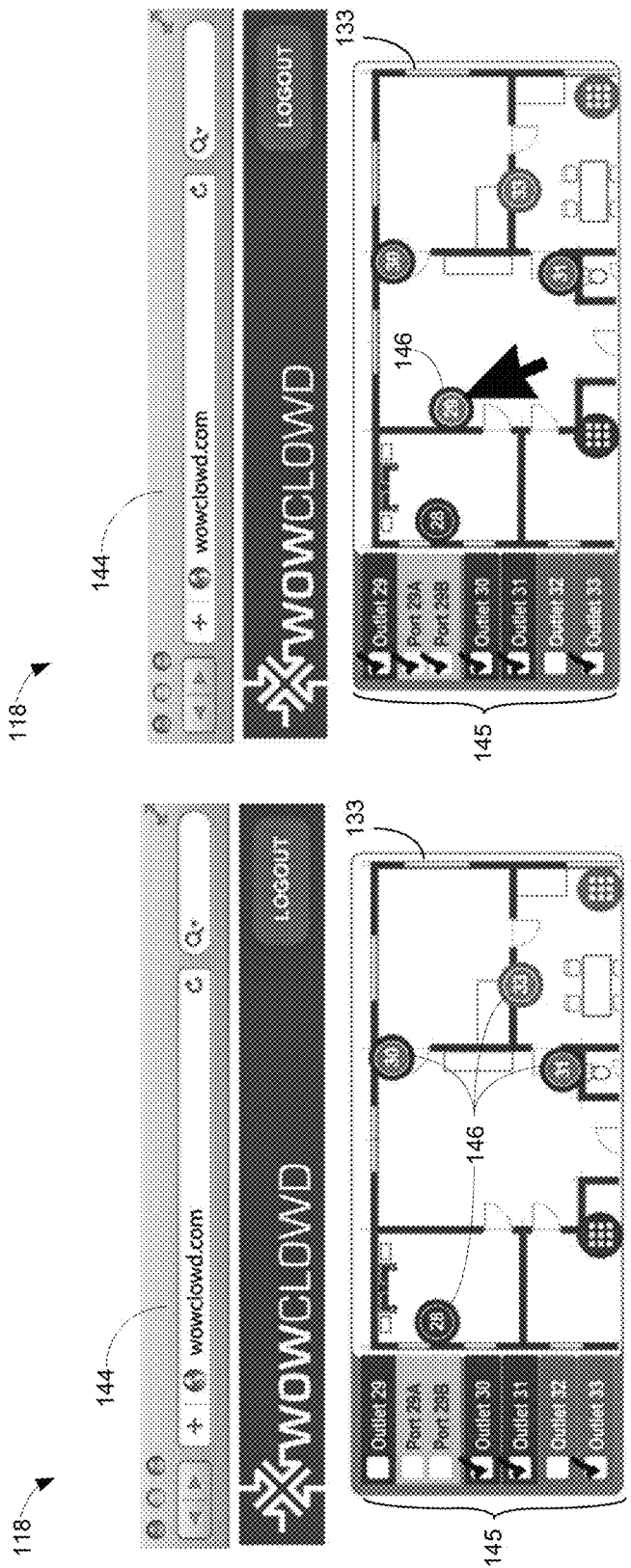

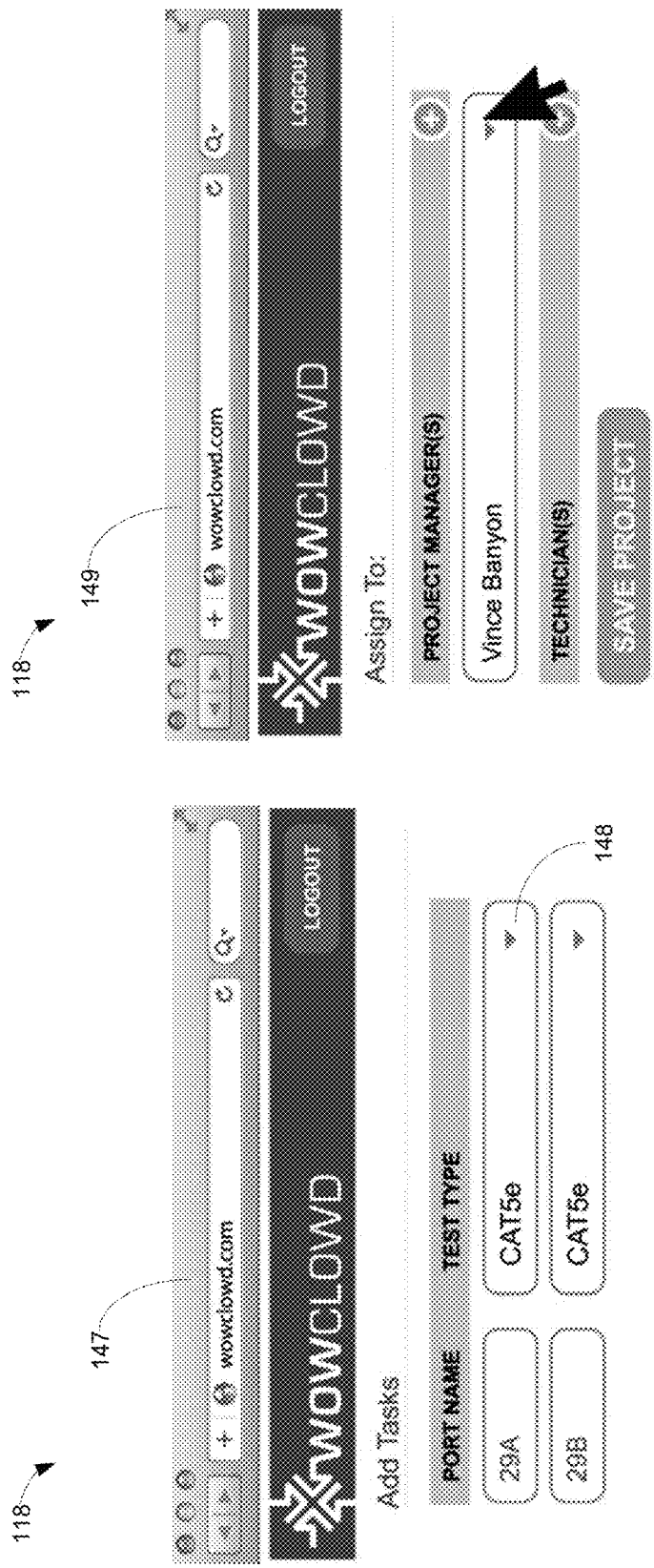

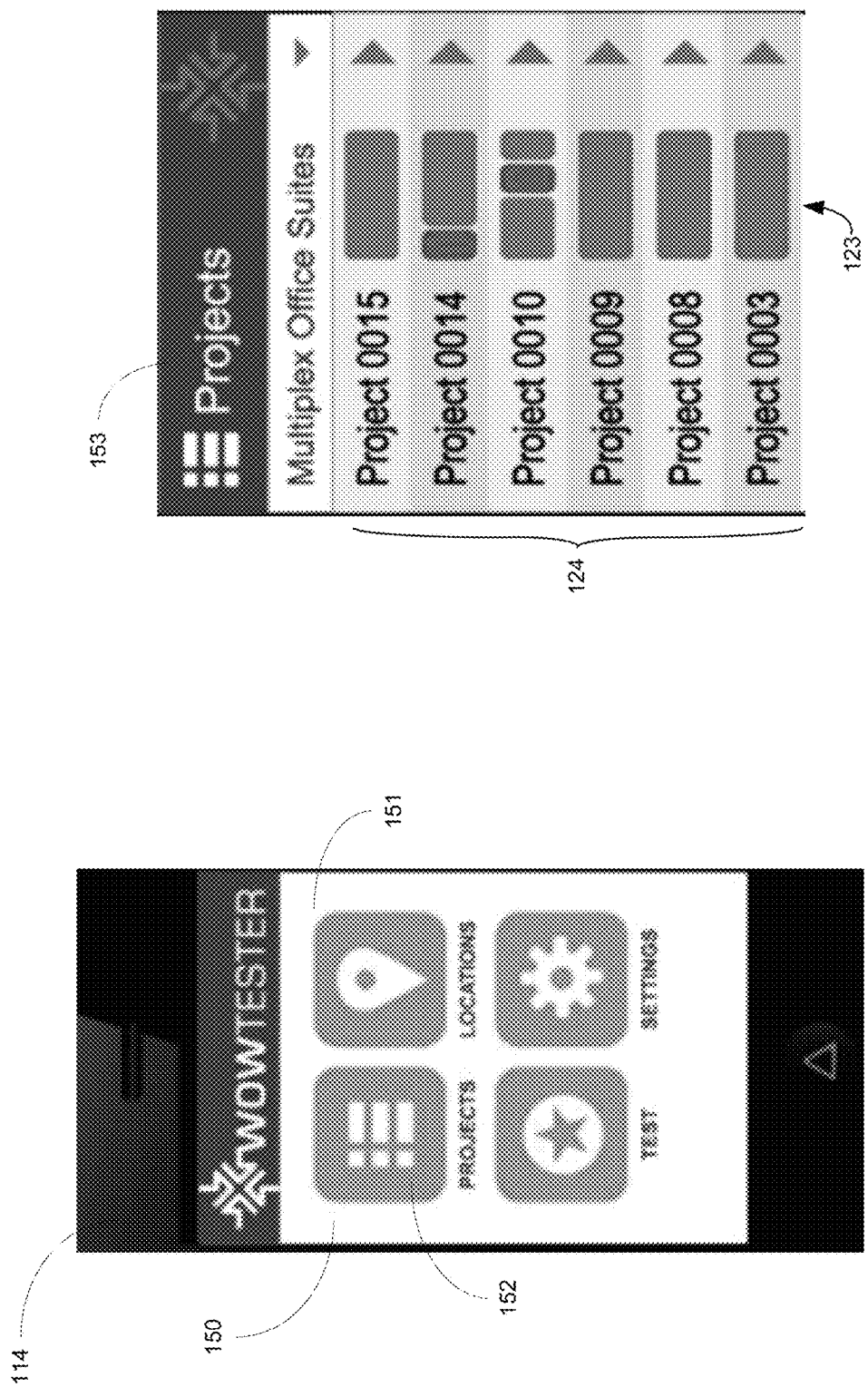

US 10,284,632 B2

ELECTRONIC TESTING DEVICE

PRIORITY

The present application claims the benefit under 35 U.S.C. § 120 of U.S. patent application Ser. No. 14/230,990 filed Mar. 31, 2014, which is hereby incorporated by reference in its entirety.

The U.S. patent application Ser. No. 14/230,990 filed Mar. 31, 2014 claims the benefit under 35 U.S.C. § 119(e) of U.S. Provisional Application Ser. Nos. 61/806,554, filed Mar. 29, 2013, which is incorporated herein by reference; and 61/877,813, filed Sep. 13, 2013, which is incorporated herein by reference.

TECHNICAL FIELD

The present disclosure generally relates to the field of cabling verification, and more particularly to low voltage circuit testing devices.

BACKGROUND

Conventional cable testing devices are utilized by Information Technology Technicians around the world every day to test Cat 5 and other cables that facilitate data communications in buildings. Every cable must be tested when installed and/or modified to verify that it is working properly. Each test is conducted from one termination point (usually in a wall jack) to a second termination point (often in a patch panel in a data/computer closet). Conventional cable testing devices are costly, heavy and provide limited functionality.

When testing has been completed on each connection and results marked for each wall connection, technicians must bring equipment and floor plans back to the office where a CAD technician will update the CAD floor plan and cabling diagram for the facility. This process leaves room for human error or worse yet, lost records.

SUMMARY

Systems and methods for cabling verification may include one or more operations including, but not limited to: receiving floor plan data representing a floor plan of a premises; receiving at least one user input specifying a location of at least one cabling endpoint relative to the floor plan; receiving at least one user input selecting at least one cabling verification test for the at least one cabling endpoint; receiving one or more cabling verification test results for the at least one cabling endpoint obtained by at least one testing device; and updating at least one database element associated with the at least one cabling endpoint and maintained by the cloud-based server.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 2A shows a system for network cabling verification;
FIGS. 3A-14 show various interfaces presented by a system for network cabling verification.

DETAILED DESCRIPTION

Reference will now be made in detail to the subject matter disclosed, which is illustrated in the accompanying drawings.

Figure 1:
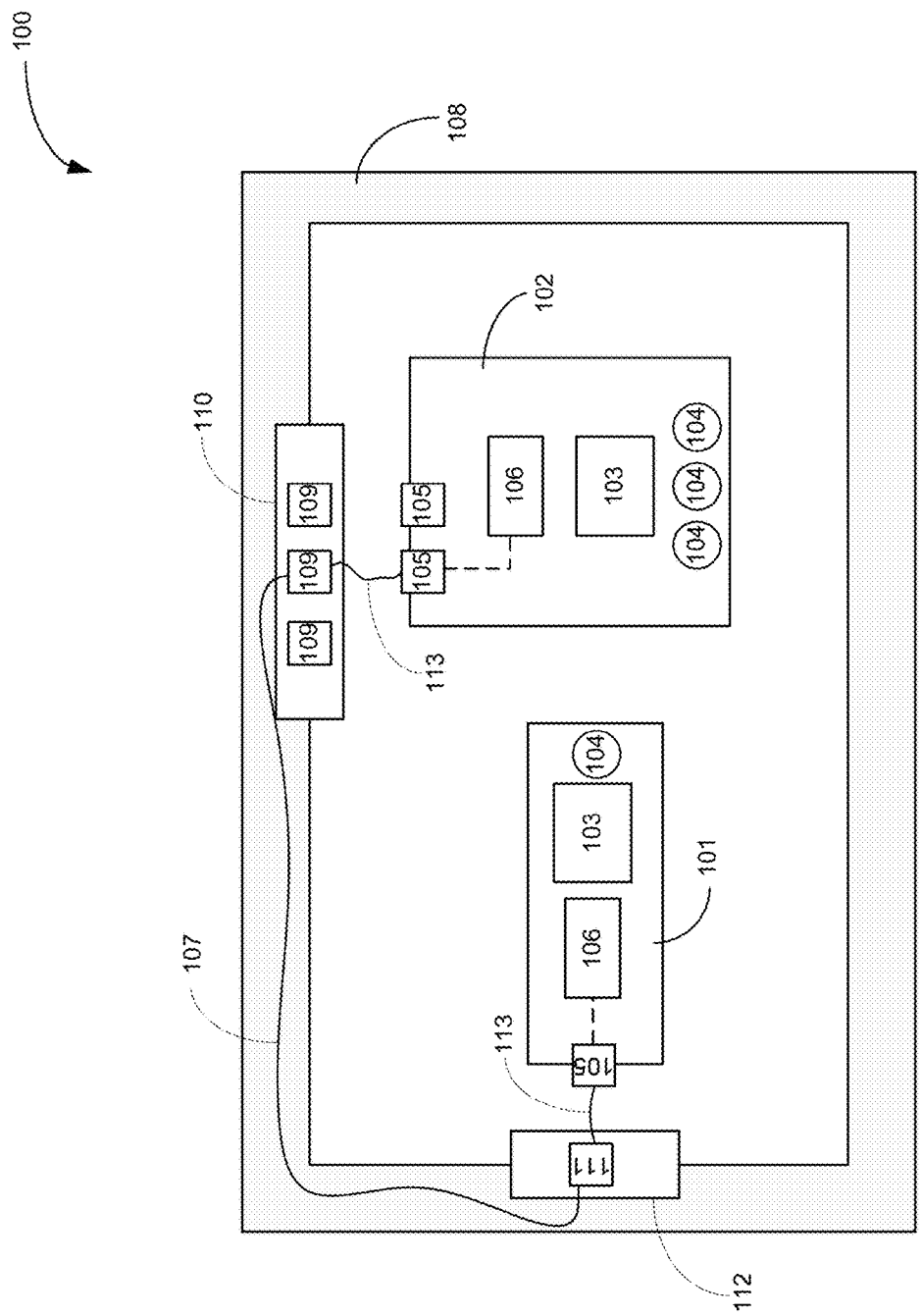
FIG. 1 shows a system for network cabling verification.
Figure 2C:
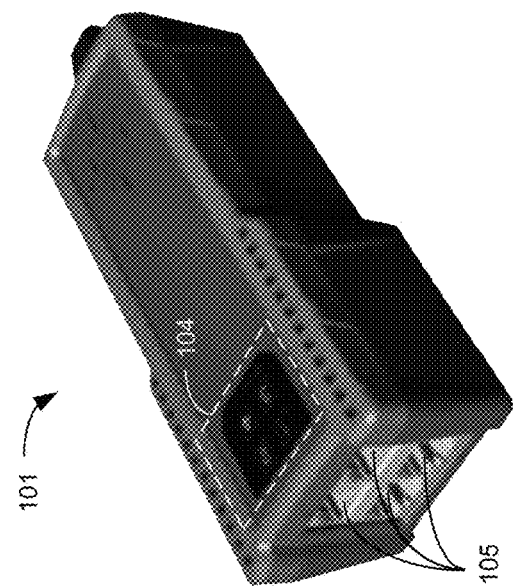
FIG. 2C shows a device for network cabling verification.
Figure 2B:
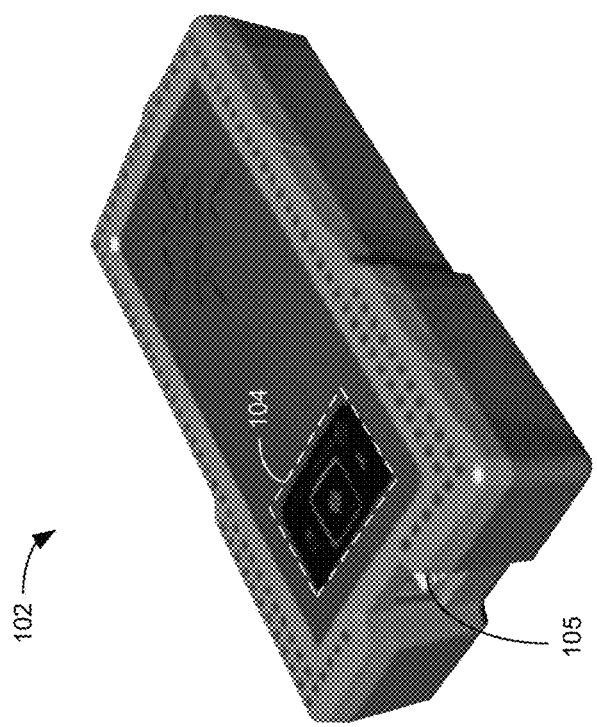
FIG. 2B shows a first device for network cabling verification.

Referring to FIGS. 1-2C, a cabling testing system 100 may include a first testing device 101 and a second testing device 102. The testing device 101 and the testing device 102 may respectively include a power source 103 (e.g. a battery), one or more display elements 104 (e.g. LED indicators, LCD displays, and the like), one or more ports 105 (e.g. data cable jacks such as RJ 45 jacks, wire clamps, and the like), and a processing device 106 (e.g. a microprocessor) configured for transceiving signals via the ports 105 and performing one or more circuit and/or network connectivity verification tests and generating testing results (e.g. detected voltages on a cable 107, network connectivity data (e.g. IP addresses, bit rates, Packet Captures, Network Scans, Network Mapping, DNS resolution, DHCP, PING, TraceRoute, IPert IPv4 and IPv6, etc.) associated with one or more networked devices connected to a cable 107, and the like). Cable 107 may refer to one or more insulated wires, conductors or fibers that may be employed to transmit electrical, optical and communication signals. Wires or conductors may include gold, copper and other electrical conducting metals. Optical fibers may include glass optical fibers, plastic optical fibers and other optical fibers. The testing device 101 may be a passive device configured to simply return test signals received at a port to the testing device 102. In another embodiment, the testing device 102 may be an add-on device connectable (e.g. wirelessly or via a connecting data cable) to existing network connectivity testing equipment. In another embodiment, the display elements 104 of the testing device 102 (e.g. an LCD display screen) may be omitted and any display operations associated with the cable testing and/or results may be provided via a mobile device 114 as further described below. Both the testing device 102 and testing device 101 may be equipped with removable sleeves which can be color-coded. The cases of the testing device 101 and testing device 102 may be configured to be coupled (e.g. snapped together). The incorporation of the eyelet and belt clip allows easy transfer and operational use.

The testing device 102 may include a heavy duty (e.g. multi-core) processing device 106. This may allow for testing on a Gigabit Ethernet cable 107. Also, a heavy duty processing device 106 may allow simultaneous operation of multiple applications. The testing device 102 may include a Linux operating system embedded hardware/server. Using a combination of the features of Linux OS The testing device 102 may be configured to receive firmware updates by BLUETOOTH and/or a network connection.

Upon connection of the testing device 101 and the testing device 102 to the outlet port 111 and the patch panel port 109, respectively, the testing device 101 and the testing device 102 may perform various pairing operations prior to the initiation of cable testing. It may be the case that the testing device 101 may include an associated identifier (e.g. a device number, serial number, authentication code, etc.) maintained in memory. The associated identifier may be a globally unique identifier. When the testing device 102 and the testing device 101 are connected via a cable 107, the testing device 102 may query the testing device 101 for its associated identifier. The testing device 101 may transmit its associated identifier to the testing device 102 (e.g. in the form of a voltage modulated serial communication) which may verify the validity of the associated identifier (e.g. compare the associated identifier to a list of known valid identifiers, perform one or more checksum operations, etc.) prior to the commencement of cable testing operations. Once the associated identifier has been verified, the testing device 102 and the testing device 101 may commence cable testing operations.

In order to conduct a cabling verification test on a cable 107 (e.g. low-voltage CAT3, CAT5, CAT5E, CAT6, UTP, STP, SSTP and/or FTP data cables and/or standard voltage electrical wiring) forming a portion of a electrical network within a premises 108 (e.g. a home, office, school, and the like), the ports 105 of the testing device 102 and the testing device 101 may be coupled to a patch panel port 109 of a patch panel 110 in a data closet and an outlet port 111 of an outlet 112, respectively, via patch cables 113. While it is contemplated that cable 107 may include one or more conductors, it is further contemplated that cable 107 may include optical fiber and various other electrical and communication mediums without departing from the scope and intent of the present disclosure.

A cabling test (e.g. cable integrity tests, network connectivity tests associated with one or more networked devices (e.g. routers, switches, end-devices, etc.)) may be initiated by a technician whereby the testing device 102 may generate one or more test signals which may be transmitted via the cable 107 to the testing device 101 and/or another connected network device. The testing device 101 may receive the test signals and transmit response signals via the cable 107. The testing device 102 may receive those response signals and perform one or more processing operations (via the processing device 106) to verify whether or not the cable 107 is transmitting data as intended (e.g. that the cable 107 is connected properly, that the component wires of the cable 107 have been terminated correctly without being crossed, all the wires in the cable 107 are all transmitting data, etc.). When data is obtained from a test, it may be stored in the master device, stored in the mobile device and may be stored in cloud-based storage. Data may be further transferred to a personal computer. With location and time-stamping, data can be verified and authenticated. It is contemplated that the tests may be stored & time stamped to generate a historical data set over a network lifetime such that cable integrity may be verified over the course of its useful life. Further, data may be aggregated for comparison with other facilities.

In conventional testing systems, a technician may be required to be present at both ends of a cable 107 under test in order to place the testing device 102 and the testing device 101 properly. For example, after a first cable 107 is tested, a technician must review the facility layout drawing, coordinate via walkie-talkie or other mechanism with another technician, and then move on to a second cable 107. It is critical that both technicians are testing the same cable 107 and communicating constantly otherwise the tests will be ineffective. After a test on an outlet port 111 of a outlet 112 is complete, a technician must move the testing device 101 to an outlet port 111 of a outlet 112 at a new location of a cable 107, and another technician must move the testing device 102 to the next corresponding patch panel port 109 in the patch panel 110 on the other end of the cable 107.

Upon completing all the tests for all wires at a facility, technicians may be required to connect the testing device 102 with a computer for downloading test data. This may require technicians to return to their office where the storage computer is located. They must then physically hook a cable up to the tester and download all results. After the results are downloaded, they can be labeled manually by another technician in a spreadsheet to show the facility where the test took place, the date of the test, the test result, and the like. After reviewing the building drawings and importing the data, if an error is identified or a cable missed, the technician must be sent back to the job site to conduct the missed tests. A final CAD drawing may be generated showing all cables that have been tested and labeled.

Referring now to FIGS. 1 and 2, in accordance with an embodiment of the present disclosure, the cabling testing system 100 may include at least one mobile device 114 (e.g. a touch-screen enabled smart phone or tablet computer, laptop computer, application-specific device, and the like). The mobile device 114 may be wirelessly couplable to a wireless transceiver 115 of the testing device 102 and/or the testing device 101 (not shown).

In one embodiment, mobile device 114, the testing device 102 and/or the testing device 101 may communicate via respective transceivers implementing a BLUETOOTH protocol. While BLUETOOTH may be employed, other wireless communication protocols may also be utilized, such as Wi-Fi, RFID, Infrared, peer-to-peer, and the like. Wireless signals 172 transceived between the mobile device 114 and the testing device 102 and/or testing device 101 may include control signals provided by the mobile device 114 to control cable testing operations by the testing device 102/testing device 101 or data signals indicative of cable testing results provided by the testing device 102/testing device 101 to the mobile device 114.

In another embodiment, the mobile device 114 may be operably coupled to the testing device 102 and/or testing device 101 via a data cable. In yet another embodiment, the mobile device 114 itself may provide the testing signals transmitted to the outlet port 111 via a dongle interface or simple data cable physically linking (e.g. via a wired connection) mobile device 114 to a patch panel port 109 (not shown).

A cable testing application resident on the mobile device 114 may have the ability to test multiple cables simultaneously. For example, as shown in FIG. 2C, the testing device 101 may include multiple ports 105 which may be simultaneously coupled to multiple outlet ports 111. The testing device 102 may be successively connected to each of the patch panel ports 109 corresponding to the outlet ports 111 without having to modify the connections of the patch cables 113 at an outlet 112.

Further, the mobile device 114 may implement Real Time Location Services (RTLS) to simultaneously associate coordinates of the mobile device 114 with cable test results as they occur. RTLS may be implemented through the use of any available "standards-based" location services platform including, but not limited to: GPS, Wireless LAN, Cellular Services, Radio Frequency Identification, and Infrared Signal. It is contemplated that other additional location identification mechanisms may also be employed, particularly for use in the premises 108.

The cable testing application of the mobile device 114 may connect to a cloud-based network 116 (e.g. the internet) using the built-in wireless capabilities of the mobile device 114. Once a secure connection has been established and verified, the software application may upload and synchronize each test result to a related proprietary cloud-based database residing on a cloud-based server device 117 (e.g. a web server accessible over a web-browser or application implemented on the mobile device 114). The cloud-based server device 117 may implement at least one cloud-based application 118 accessible by a mobile device 114 and/or one or more additional network devices such as a laptop or desktop computer 119.

The computer 119 may access the cloud-based application 118 of the cloud-based server device 117 via web-browser software resident on the computer 119 running applications (e.g., Java applets or other applications), which may include application programming interfaces ("API's") to more sophisticated applications (such as cloud-based application 118) running on remote servers that provide the cloud-based service (cloud-based server device 117), as an example embodiment.

In an example embodiment, through the web-browser software, a user can use a computer 119 to log on to cloud-based services (e.g., by the web-browser software resident on the computer 119 communicating with cloud-based server device 117) to access a cloud-based application 118. After logging-on to the cloud-based application 118, the user may create, edit, save and delete files on cloud-based server device 117, and may establish (set up) or change/edit various options, such as user preferences and/or system settings, and/or may receive or download software (e.g., operating system or other software) or software updates, various data files or media files, user preferences and/or system settings, and other information previously stored on the cloud-based server device 117, via the cloud-based application 118 running on the cloud-based server device 117.

The cloud-based application 118 implemented on the cloud-based server device 117 may provide various interfaces facilitating cabling testing. Referring to FIGS. 3A-14 exemplary representations of such interfaces and their associated functional operations are presented. With the ability to access data via cloud-based storage, it is contemplated that floor diagrams, building specs and other information may be accessed and the data from tests may be quickly integrated by technicians in the field. The cabling testing system 100 of the present disclosure may allow management of multiple facilities by allowing the following: access to real time data diagrams; enhance management and productivity of technicians (e.g. tracking of technicians and ability to schedule technicians to appropriate locations); depict firewall locations; enable virtual testing and testing validation. As shown in FIG. 3A the cloud-based application 118 may be access protected. As such, the cloud-based application 118 may present user login interface 120 prompting a user for an authentication (e.g. a user name and password) in order to further access the functionality of the cloud-based application. Differing access levels may provide different access to the functionality of the cloud-based application 118. For example, client and project creation operations may only be available to users having administrative privileges. Project specification and configuration operations may be available to project managers and technicians. Project status query operations may be available to clients.

Figures 4A, 4B:
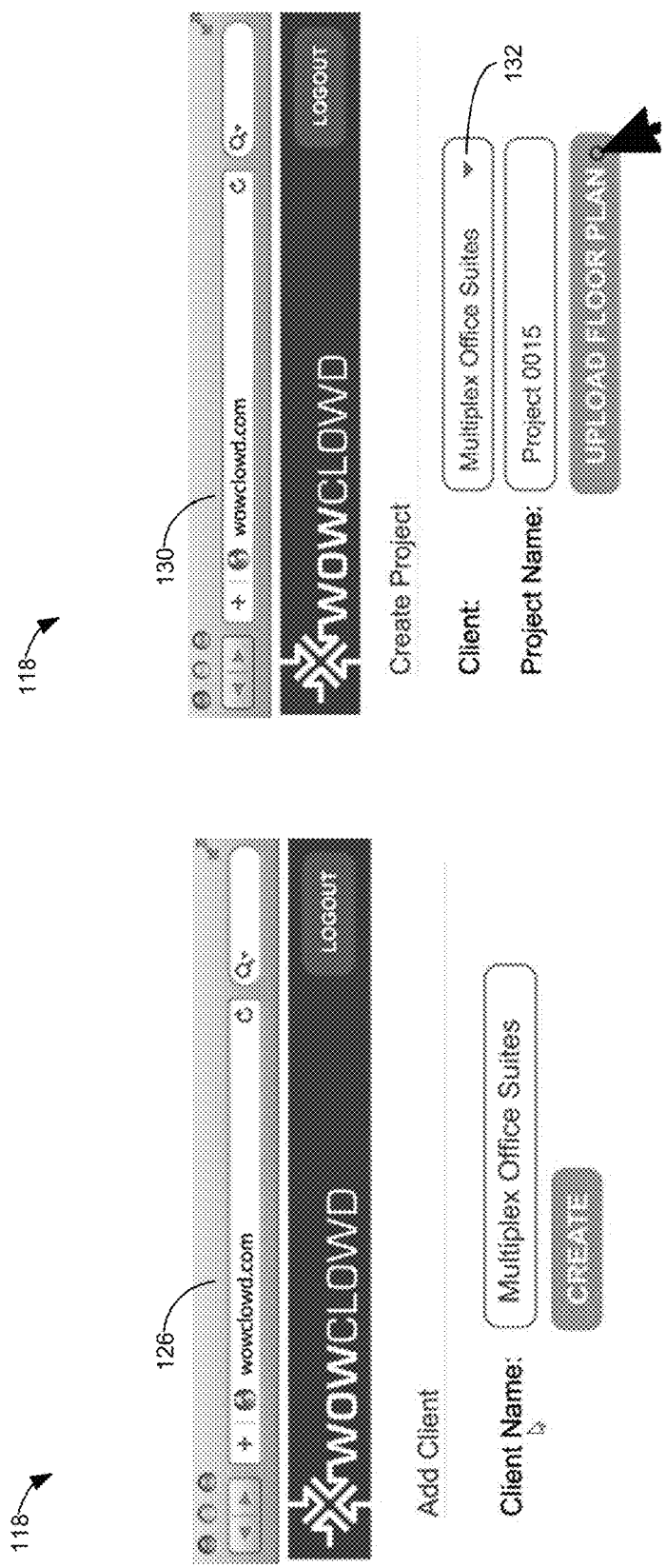

Referring to FIG. 3B, following authorization of a user, the cloud-based application may present a dashboard interface 121. The dashboard interface 121 may include project status data (e.g. most recent activity date 122, one or more cable testing completion level indicators 123, etc.) associated with one or more cable testing projects list 124. The dashboard interface 121 may further include one or more actuatable interface elements. For example, the dashboard interface 121 may include a "Create New Client" interface element 125. Actuation of the "Create New Client" interface element 125 may transition the cloud-based application 118 to present a client creation interface 126 as shown in FIG. 4A. The client creation interface 126 may allow a user to add a new client reference to a cable testing database 127 maintained by the cloud-based server device 117, as shown in FIG. 2A. The client creation interface 126 may present a Client Name data entry field whereby a user may enter a client name. Clicking or pressing a "Create" interface element may cause the addition of a new client 128 to the cable testing database 127.

Referring again to FIG. 3B, the dashboard interface 121 may further include a "Create New Project" interface element 129. Actuation of the "Create New Project" interface element 129 may transition the cloud-based application 118 to present a project creation interface 130 as shown in FIG. 4B. The project creation interface 130 may allow a user to add a new cable testing project 131 to a given client 128 in the cable testing database 127 maintained by the cloud-based server device 117 (as shown in FIG. 2). The project creation interface 130 may present a pull-down client list 132 whereby a user may select an existing client 128. The project creation interface 130 may further present a Project Name data entry field whereby a user may enter a new project name. The project creation interface 130 may further provide for the importation of design file representative of a floor plan of a premises 108 subject to a cable testing project. For example as shown in FIG. 5A, a floor plan 133 may include a graphical representation (e.g. a digital CAD file) of one or more environmental or structural features corresponding to analogous features of the premises 108. The floor plan 133 may be captured (e.g. via a camera) and/or uploaded from a mobile device 114 and/or the computer 119.

Figure 5B:
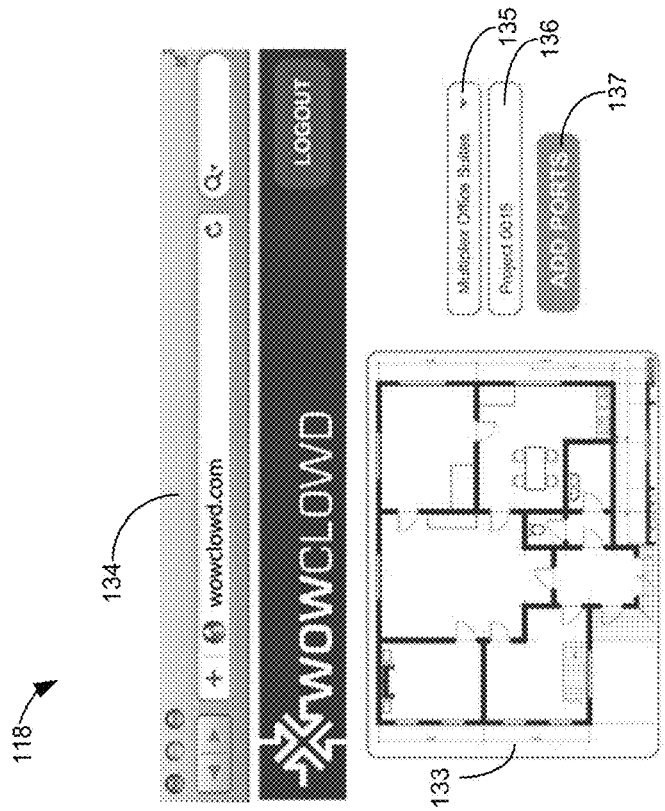
Figure 5A:
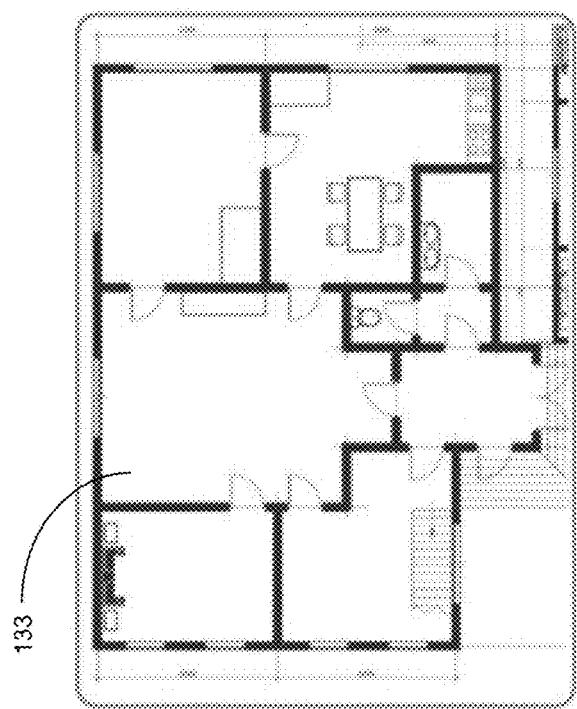

Following importation of the floor plan 133 into a project 131, the cloud-based application 118 may load the floor plan 133 and provide a port addition interface 134 as shown in FIG. 5B to allow for the specification of locations of outlets 112 and/or patch panels 110 on the floor plan 133. The port addition interface 134 may present a client selection menu 135 (e.g. a pull-down menu including a listing of all available clients in the cable testing database 127) and a project selection field 136 (e.g. a pull-down menu including a listing of all projects associated with a client previously selected via the client selection menu 135, a text entry field, and the like). Following selection of a particular client and project, an "Add Ports" interface element 137 may be activated transitioning the port addition interface 134 to present an end-point specification interface 138 as shown in FIG. 6A.

The end-point specification interface 138 may present an endpoint specification field 139 where a name of a port to be added may be entered. Further details regarding an endpoint to be added may be specified by one or more endpoint detail menus 140. For example, an endpoint type 141 (e.g. an outlet, patch panel, etc.) and a number of ports 142 associated with that specified endpoint type may be selected.

Figures 6A, 6B:
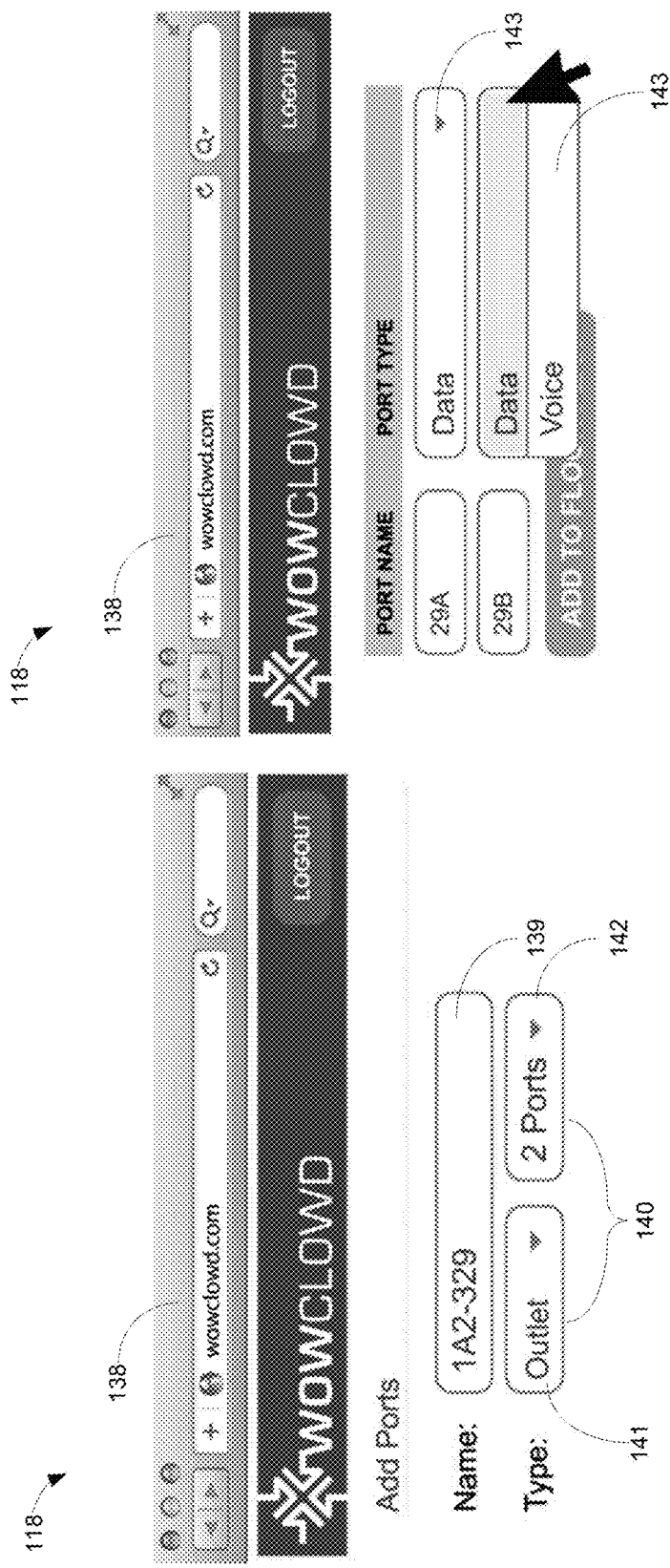

Referring to FIG. 6B, the end-point specification interface 138 may further present a port type specification menu 143. For example, the port type specification menu 143 may include a pull-down menu listing selectable port types (e.g. data, voice, etc.) for a given port of an endpoint.

Following creation and specification of one or more endpoints via the end-point specification interface 138, the end-point specification interface 138 may transition to an endpoint positioning interface 144. As shown in FIGS. 7A and 7B, the endpoint positioning interface 144 may include endpoint selection menu 145 associated with previously created endpoints (e.g. Outlet 29, Outlet 30, Outlet 31, Outlet 32, Outlet 33, etc). Selection of a given endpoint from the endpoint selection menu 145 may result in the display of an endpoint icon 146 representing the selected endpoint within the floor plan 133 (e.g. the selection of the radio button associated with Outlet 29 results in the display of an Outlet 29 icon in the floor plan 133). Once the endpoint icon 146 is included in the floor plan 133, its position may be moved relative to the features (e.g. walls) of the floor plan 133 in order to indicate the desired location of the associated endpoint within the premises 108 modeled by the floor plan 133. Further, a portion of each endpoint icon 146 (e.g. an exterior ring) may be color coded to correspond with other endpoints on the same network or linked to a common patch panel. Still further, each endpoint icon 146 may also be color coded to reflect its testing status (e.g. red indicates a failed test associated with an endpoint, green indicates a successful test associated with an endpoint, and grey indicates that no test has been performed on an endpoint). Still further, hovering over an endpoint icon 146 (e.g. with a mouse cursor) may result in the display of endpoint details (e.g. endpoint name, port types, port numbers, etc.) associated with an associated endpoint via a pop-up window.

Following completion of port addition for a given project, one or more cabling tests may be specified for a given port. As shown in FIG. 8A, following selection of a given endpoint (e.g. double clicking on a endpoint icon 146 as shown in FIGS. 7A and 7B) a port testing specification interface 147 may be provided displaying the port names for a selected endpoint and presenting a test type selection menu 148. The test type selection menu 148 may be a pull-down menu including various possible tests for an endpoint (e.g. CAT5e testing, CAT6 testing, etc.). Selection of a test type adds that particular test to a testing queue associated with the endpoint.

Following completion of port addition and cabling test specification, a project may be assigned to one or more project managers and/or one or more technicians tasked with performing the cable testing operations. As shown in FIG. 8B, the cloud-based application 118 may further present a personnel specification interface 149. The personnel specification interface 149 may allow for the specification of personnel having access to a given project.

In association with the specification of endpoint configurations (e.g. via a computer 119) as described above, this endpoint configuration data maintained by the cable testing database 127 may be pushed to mobile device 114 (e.g. substantially in real time) from the cloud-based server device 117 over the cloud-based network 116. Once received at the mobile device 114, the mobile device 114 may employ a cable testing application resident on the mobile device 114 to perform one or more cable testing operations on at least one cable 107 via the testing device 102 and the testing device 101.

Referring to FIG. 9A, the cable testing application may present a testing interface 150 via a display device (e.g. a touch screen display 151) of a mobile device 114. The testing interface 150 may include a selectable project status interface element 152. Upon activation of the project status interface element 152, the cable testing application may present a project status interface 153. The project status interface 153 may include information corresponding to that found in the dashboard interface 121 of the cloud-based application 118. For example, the project status interface 153 may include the cable testing projects list 124 and the cable testing completion level indicators 123. Referring to FIG. 10A, upon selection (e.g. detection of a user touch to a portion of the touch screen display 151 corresponding to a project) of a given cable testing project from the project status interface 153, the cable testing application may present an endpoint selection interface 154 displaying the floor plan 133 associated with the project and including the endpoint icons 146 representative of locations of endpoints previously specified for the project.

Figure 10B:
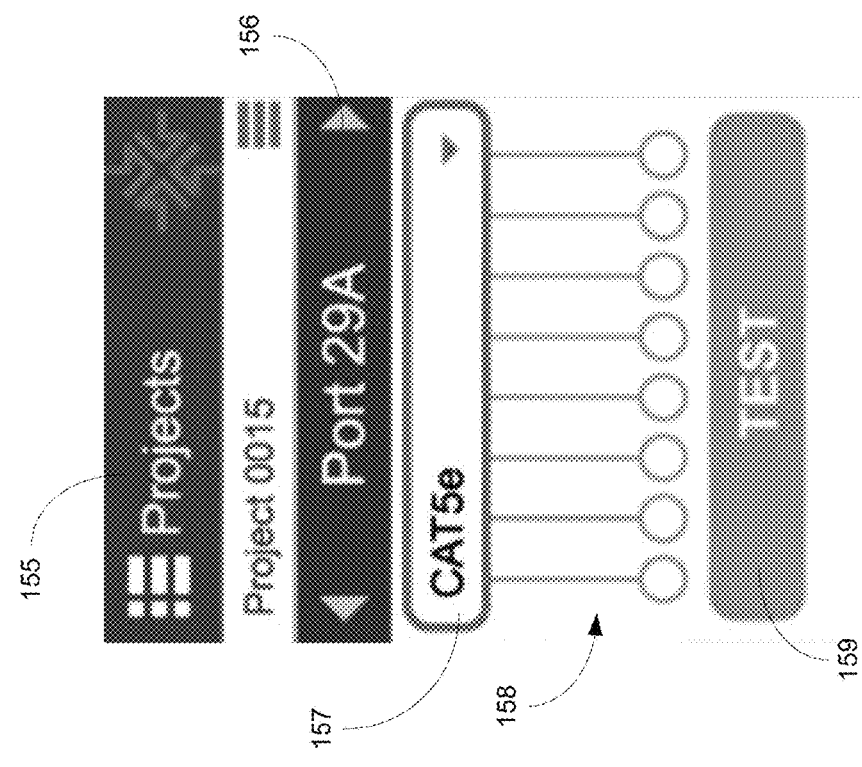
Figure 10A:
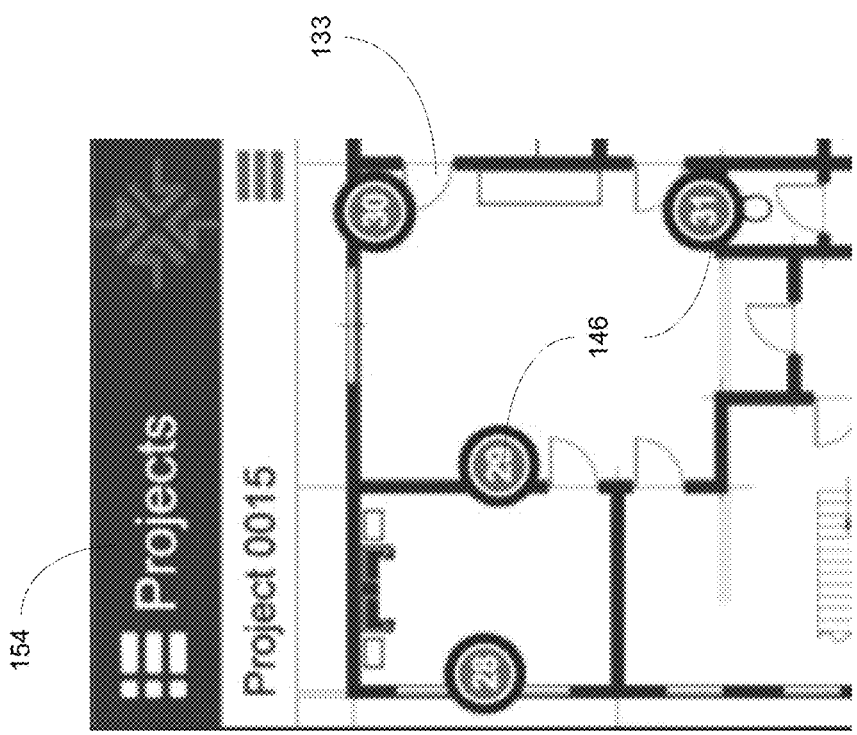

Referring to FIG. 10B, upon selection of a given endpoint icon 146 from the endpoint selection interface 154, the cable testing application may present a port testing interface 155. The port testing interface 155 may display a port indicator 156 indicating a port currently subject to test, a test indicator 157 indicating the test to be performed on the port and a wiring diagram 158 representative of the cabling schematic associated with the port/cable subject to test. Upon activation of a "Test" interface element 159 of the port testing interface 155, as shown in FIG. 2A, the mobile device 114 may transmit one or more control signals 172 to a testing device 102 coupled to a patch panel port 109/cable 107/outlet port 111 subject to testing causing the testing device 102 and the testing device 101 to perform one or more cable testing operations on the outlet port 111 as described above.

Following completion of the cable testing operations by the testing device 102 and the testing device 101, the testing device 102 may transmit cable testing result data signals 172 to the mobile device 114.

Figure 11B:
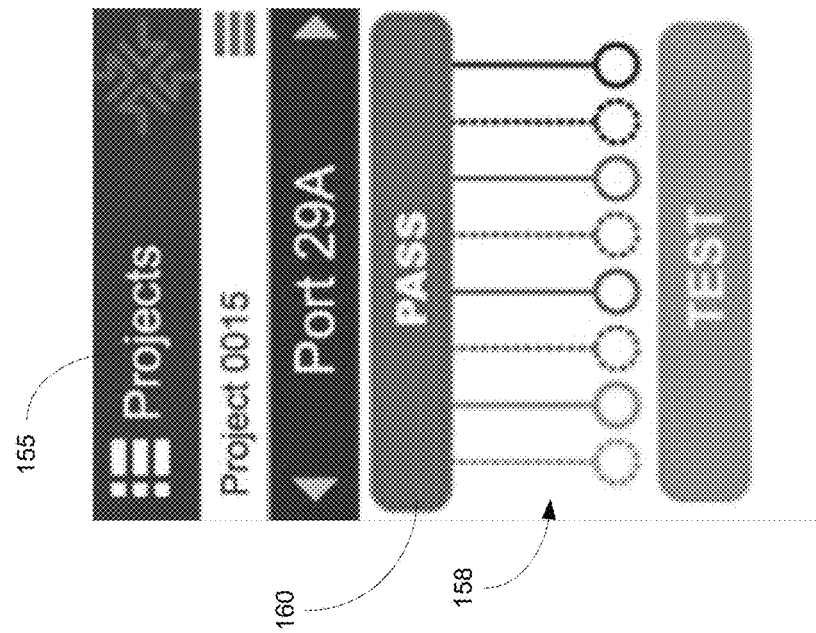
Figure 11A:
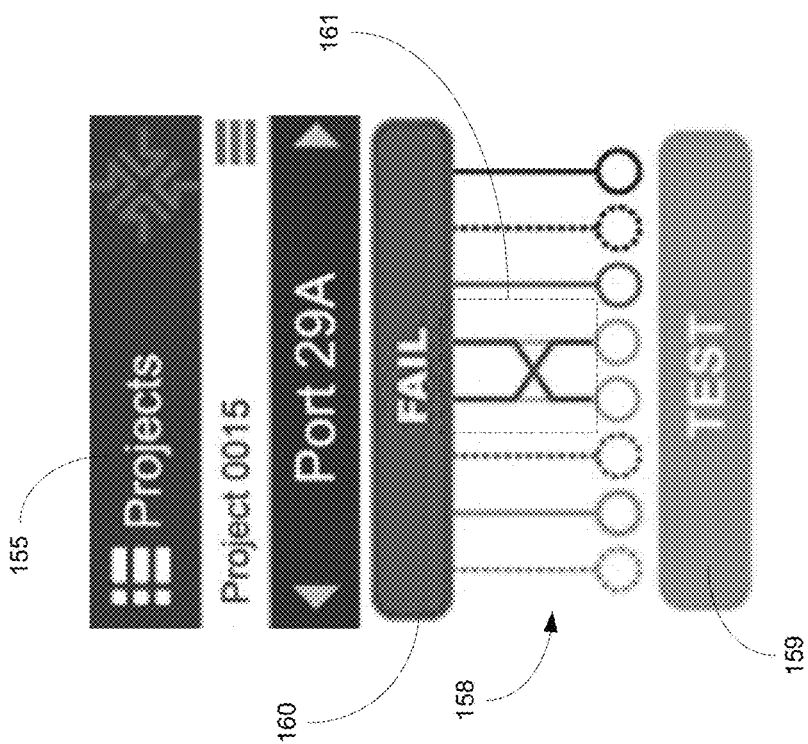

As shown in FIGS. 11A and 11B, a test result indicator element 160 of the port testing interface 155 may provide a visual indication of the result of the test on the selected port. For example, as shown in FIG. 11A, in the case of an unsuccessful test, the test result indicator element 160 may display "FAIL" and turn red. Further, the portion 161 of the wiring diagram 158 associated with the failure may also be indicated (e.g. colored red and an indication of crossed wires displayed). Alternately, as shown in FIG. 11B, in the case of an successful test, the test result indicator element 160 may display "PASSED" and turn green. Further, the wiring diagram 158 may indicate correct connection of the respective color-coded wire pairs of the cable 107. While the test failure depicted in FIG. 11A is shown with respect to a failure between a designed conductor pair, the cable testing signals transceived between the testing device 102 and the testing device 101 may be provided in a manner other than with respect to the designed pair-wise configuration of the cable. For example, each upstream conductor of a cable 107 may be tested in a round-robin manner with any or all other downstream conductors to perform a comprehensive test of all wire pair combinations. Also, as noted above, it may be the case that the testing device 101 includes one or more display elements 104. These display elements 104 may be indicative of a cable testing result. For example, the testing device 101 may include one or more display elements 104 that turn red in response to an unsuccessful cabling test and/or one or more display elements 104 that turn green in response to a successful test.

Figures 12A, 12B:
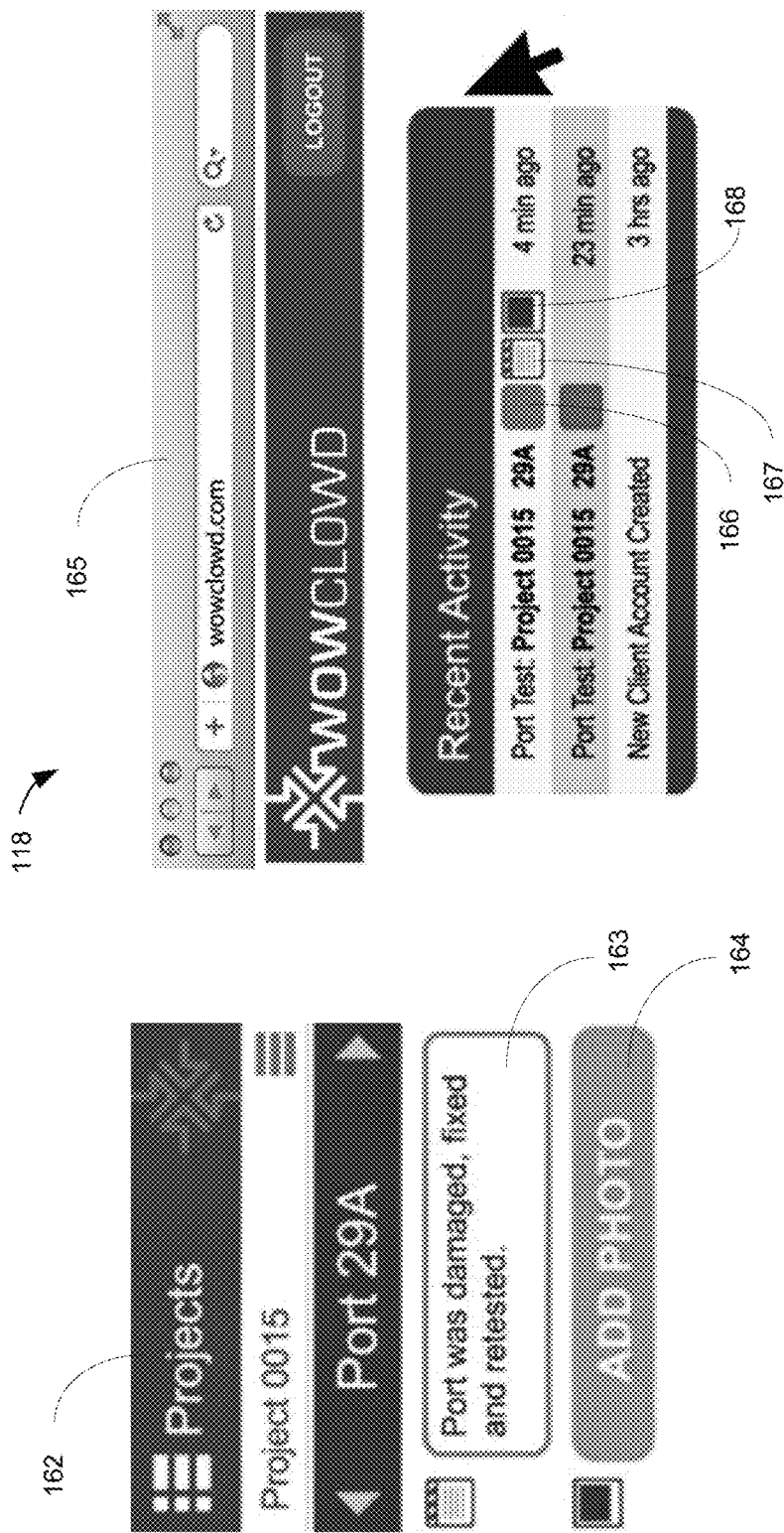

In addition to performing testing operations, the cable testing application may further provide test documentation functionality. For example, as shown in FIG. 12A, the cable testing application may present a test documentation interface 162. The test documentation interface 162 may include a test notes field 163 where a technician may enter text-based notes associated with a cable test for the selected port. Further, the test documentation interface 162 may include an "Add Photo" interface element 164. Activation of the "Add Photo" interface element 164 may cause the mobile device 114 to either open a native stored photo/video gallery maintained in memory of the mobile device 114 to allow for selection of a previously obtained photo or video associated with the port subject to testing or to open a native camera application of the mobile device 114 to allow for the capture of a new photo or video associated with the port subject to testing.

Figures 13A, 13B:
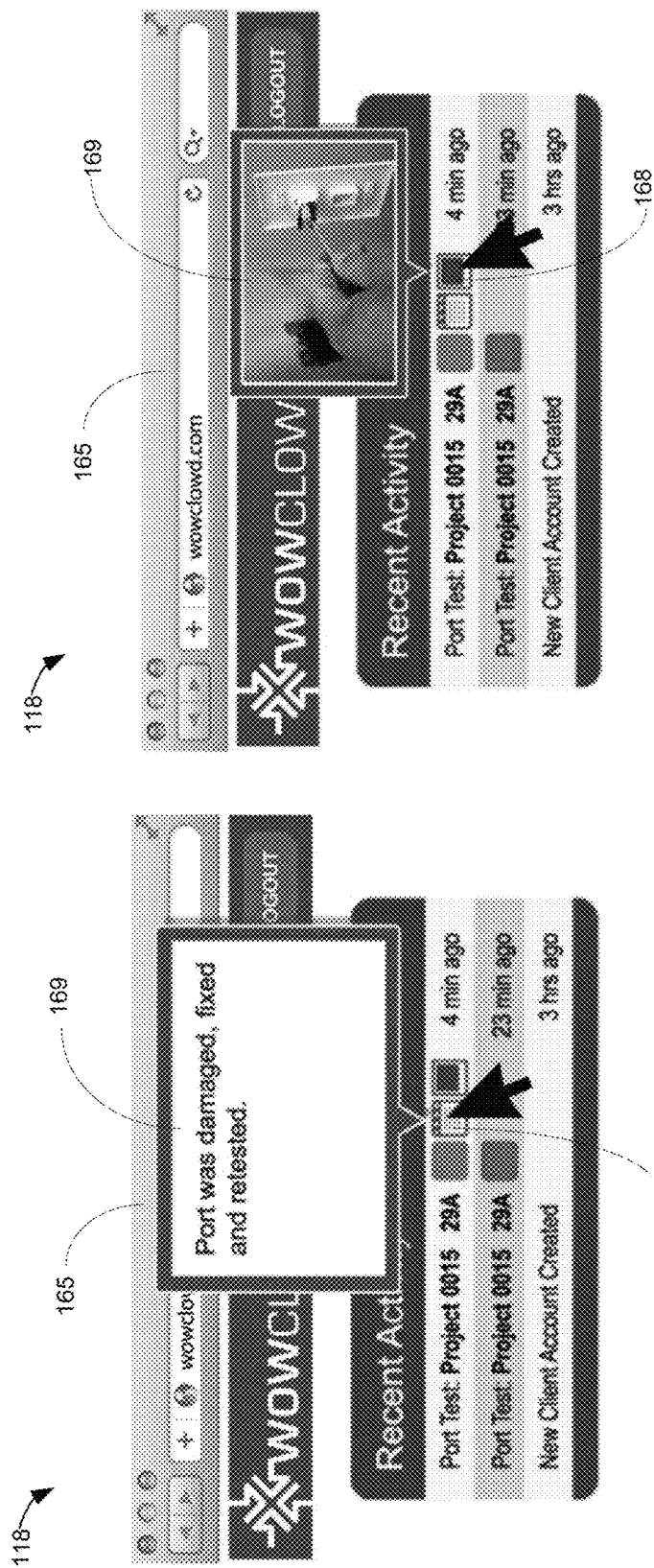

Following completion of one or more testing operations by the mobile device 114 via the cable testing application, the mobile device 114 may transmit the test results and documentation data along with relevant metadata (e.g. time stamps for cabling tests, GPS coordinates associated with the mobile device 114 obtained at the time of the test, etc.) via the cloud-based network 116 (e.g. substantially in real time) in order to update the cable testing database 127 maintained by the cloud-based server device 117. After the data of the cable testing database 127 is updated, when accessing of the cable testing database 127 by a computer 119 via the cloud-based application 118, the cloud-based application 118 will reflect the updated testing data associated with a given project. For example, as previously shown in FIG. 3B, the dashboard interface 121 may be updated to include a current most recent activity date 122, and current cable testing completion level indicators 123. Further, as shown in FIG. 12B, the cloud-based application 118 may further present a "Recent Activity" interface 165. The "Recent Activity" interface 165 may provide regarding the most recent account activity (e.g. creation of a new client or project) or testing activity (e.g. pass/fail status of a recent port test with associated technician notes, photos and videos) having occurred since the last time the dashboard interface 121 was accessed. For example, the "Recent Activity" interface 165 may include a port-specific test status indicator 166, a text documentation indicator 167 and/or a photo/video documentation indicator 168. As shown in FIGS. 13A and 13B, respectively, hovering (e.g. with a mouse cursor) over the text documentation indicator 167 or the photo/video documentation indicator 168 may result in the display (e.g. via a pop-up window) of documentation data 169 associated with the related port test.

Figure 14:
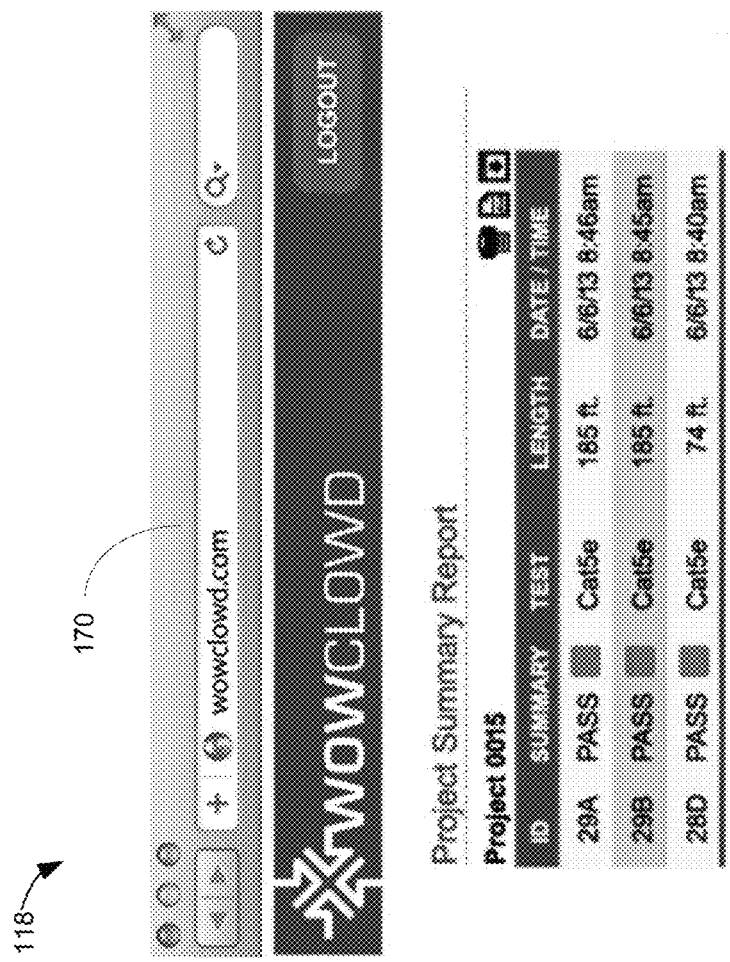
Figure 15:
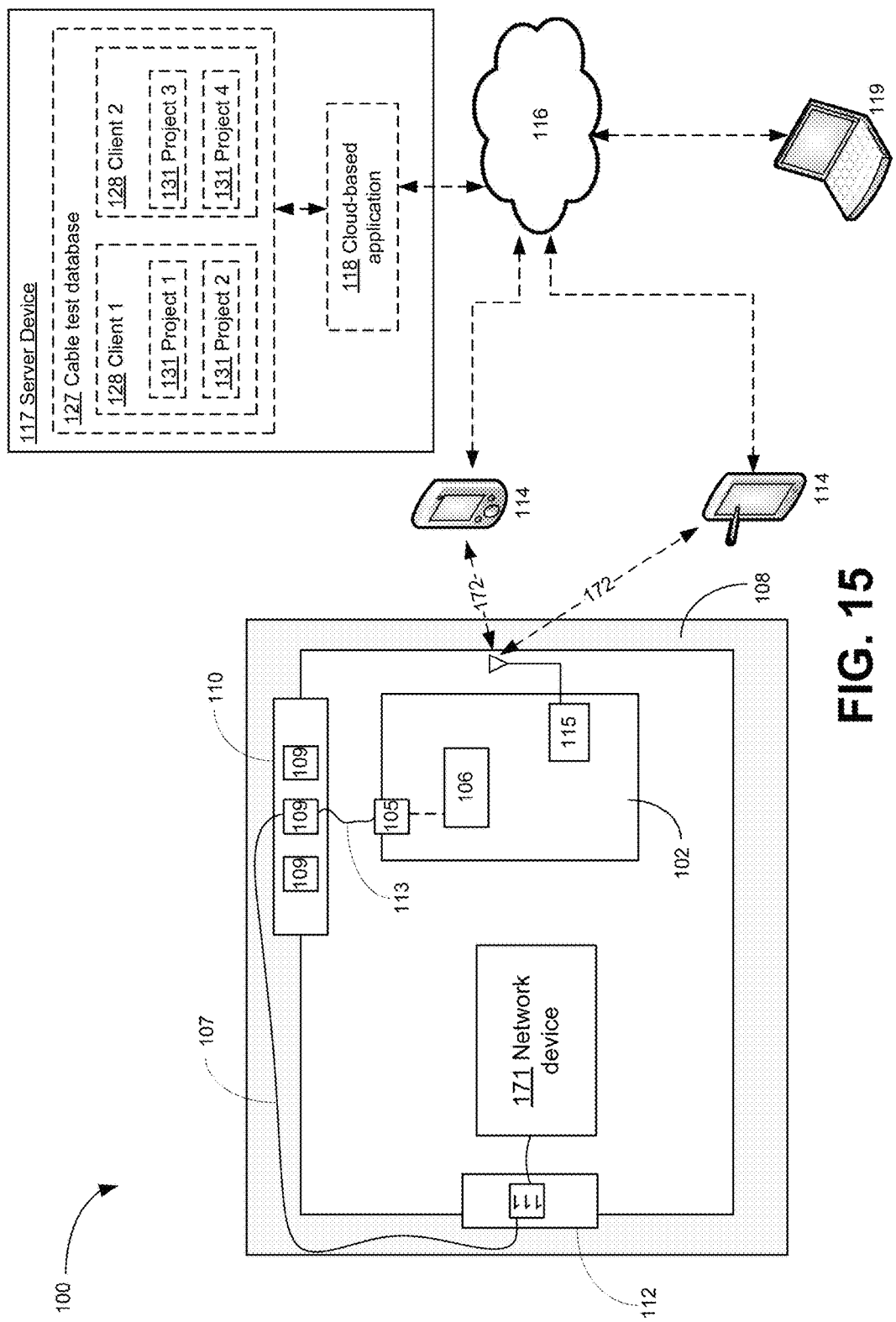
FIG. 15 shows a system for network performance verification.

Referring to FIG. 14, at any time during a cable testing project or at the completion of a project, the cloud-based application 118 may be queried for a project summary report interface 170. The project summary report interface 170 may include printing and download options to obtain project summary files which may be provided to a customer to provide a clear snapshot of the progress of a cable testing project.

Figure 16:
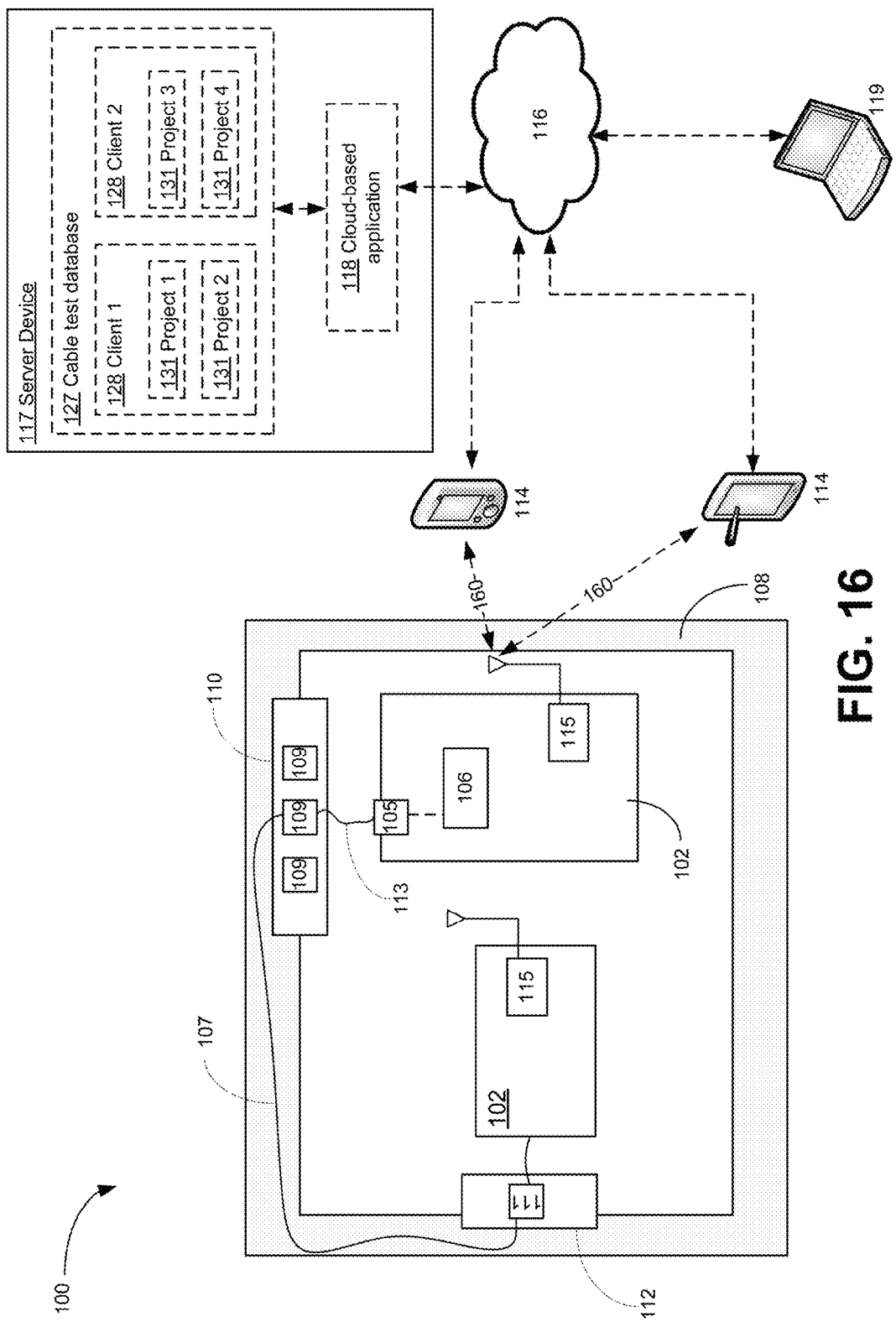
FIG. 16 shows a system for network performance verification.

As noted above and shown at FIG. 16, a testing device 102 connected into a segment can perform a variety of advanced network tests for a network including one or more networked devices 171. For example, Advanced Network testing may include: Packet Captures, Network Scans, Network Mapping, DNS resolution, DHCP, PING, TraceRoute, IPert IPv4 and IPv6. Following completion of the tests results may be uploaded to the cloud-based server device 117 via a mobile device 114 linked to the testing device 102.

In another embodiment, a first testing device 102 and a second testing device 102 (each having wireless connectivity and advanced processing capabilities) may be coupled to each other. In such a configuration, testing across a cable 107 may include speed, packet loss, latency, and jitter.

Cable testing system 100, as discussed, may be employed to perform a cable verification test on a cable 107. Cable testing system 100 may be configured to test continuity functions such as wiremap and toning but may further include a time domain reflectometer for determining a length to the end of cable 107. Cable testing system 100 may be configured to provide a visual fault locator employed to verify contiguous fiber connections and fiber polarity.

In an alternative embodiment, cable testing system 100 may be configured to also perform a cable qualification test. For example, cable testing system 100 may be configured to test whether cable 107 may support signaling of a specific network technology and whether it may support various network speeds such as 10 BASE-T, 10 BASE-TX, VoIP, or Gigabit Ethernet. Additionally, cable testing system 100 may be configured to perform troubleshooting such as distance to a problem and link configuration issues such as speed/duplex/pairing.

In an additional embodiment, cable testing system 100 may be configured to perform a cable certification test. Cable certification test may include additional troubleshooting such as measurement of a distance to a defect and may include capacity information. Cable testing system 100 may be configured to perform a variety of measurements of cable 107 to determine if cable 107 is in compliance with standards set by a standards board, such as the Telecommunications Industry Association (TIA) or International Standards Organization (ISO). After review of these measurements, it may be determined if a particular cable, such as cable 107, is compliant with a category or class of cable, such as category 5e, category 6, Class D or Class E. Certification may be required by original equipment manufacturers to grant warranties for their products. It is contemplated that the measurements of cable 107 may include one or more test parameters, such as insertion loss, near end crosstalk, power sum near end crosstalk, attenuation to crosstalk ratio—near end, power sum attenuation to crosstalk ratio-near end, far end crosstalk, attenuation to crosstalk ration—far end, power sum attenuation to crosstalk ratio—far end, return loss, wire map, propagation delay, delay skew or length.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those having skill in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

What is claimed is:
1. A system for cabling verification comprising:
at least one testing device operably couplable to a first port;
a second testing device operably couplable to a second port;

one or more instructions implemented in the at least one testing device configuring the at least one testing device for:
   performing at least one cabling verification test for a cable connecting the first port and the second port;
a mobile device operably couplable to the at least one testing device;
one or more instructions implemented in the mobile device configuring the mobile device for:
   wirelessly transmitting one or more cabling verification test control signals to the at least one testing device;
   wirelessly receiving one or more cabling verification test results obtained by the at least one testing device; and
   transmitting cabling test results obtained by the at least one testing device to at least one cloud-based server device.

2. The system of claim 1, wherein the mobile device operably couplable to the at least one testing device includes:
   a mobile device wirelessly couplable to the at least one testing device.

3. The system of claim 1, wherein the one or more instructions implemented in the mobile device further configuring the mobile device for:
   receiving data indicative of at least one cabling test specified for the first port from a cloud-based server device.

4. The system of claim 1, wherein the one or more instructions implemented in the mobile device further configure the mobile device for:
   displaying at least one indicator indicative of the one or more cabling verification test results obtained by the at least one testing device.

5. The system of claim 4, wherein the displaying at least one indicator indicative of the one or more cabling verification test results obtained by the at least one testing device includes:
   displaying at least a portion of a wiring schematic associated with a detected test failure.

6. The system of claim 1, wherein the one or more instructions implemented in the mobile device further configuring the mobile device for:
   receiving at least one text-based user input corresponding to the at least one cabling verification test; and
   transmitting the at least one text-based user input corresponding to the at least one cabling verification test to at least one cloud-based server device.

7. The system of claim 1, wherein the one or more instructions implemented in the mobile device further configuring the mobile device for:
   capturing at least one image corresponding to the at least one cabling verification test; and
   transmitting the at least one image corresponding to the at least one cabling verification test to at least one cloud-based server device.

8. The system of claim 1, wherein one or more instructions implemented in the at least one testing device configuring the testing device for:
   receiving a globally unique identifier associated with the second testing device.

9. The system of claim 8, wherein one or more instructions implemented in the at least one testing device configuring the testing device for:
   receiving a globally unique identifier associated with the second testing device via a voltage modulated serial communication.

10. The system of claim 9, wherein one or more instructions implemented in the at least one testing device configuring the testing device for:
    performing at least one cabling verification test for a second cable simultaneously as performing at least one cabling verification test for the cable connecting the first port and the second port.

11. The system of claim 10, wherein the at least one testing device and the second testing device include multiple ports configured to couple with ports associated with the second cable.

12. The system of claim 1, wherein one or more instructions implemented in the mobile device configuring the mobile device for:
    determining a location associated with the at least one cabling verification test and correlating the location to the cabling verification test results.

13. The system of claim 12, wherein one or more instructions implemented in the mobile device configuring the mobile device for:
    determining a location associated with the at least one cabling verification test and correlating the location to the cabling verification test results via real time location services.

14. The system of claim 1, wherein said cable includes at least one of a conductor or optical fiber.

15. A system for cabling verification comprising:
    at least one testing device operably couplable to a first port;
    a second testing device operably couplable to a second port;
    one or more instructions implemented in the at least one testing device configuring the testing device for:
       performing at least one cabling verification test for a cable connecting the first port and the second port;
    a mobile device operably couplable to the at least one testing device;
    one or more instructions implemented in the mobile device configuring the mobile device for:
       transmitting cabling test results obtained by the at least one testing device to at least one cloud-based server device.

16. The system of claim 15, wherein the mobile device operably couplable to the at least one testing device includes:
    a mobile device wirelessly couplable to the at least one testing device.

17. The system of claim 15, wherein the one or more instructions implemented in the mobile device further configuring the mobile device for:
    receiving data indicative of at least one cabling test specified for the first port from a cloud-based server device.

18. The system of claim 15, wherein the one or more instructions implemented in the mobile device further configure the mobile device for:
    displaying at least one indicator indicative of the one or more cabling verification test results obtained by the at least one testing device.

19. The system of claim 15, wherein one or more instructions implemented in the mobile device configuring the mobile device for:
    determining a location associated with the at least one cabling verification test and correlating the location to the cabling verification test results.

20. The system of claim 15, wherein said cable includes at least one of a conductor or optical fiber.

\* \* \* \* \*